United States Patent
Teng

(10) Patent No.: US 6,723,493 B2
(45) Date of Patent: Apr. 20, 2004

(54) NEGATIVE LITHOGRAPHIC PRINTING PLATE COMPRISING A SPECIFIC COMPOUND IN THE PHOTOSENSITIVE LAYER

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 0 days.

(21) Appl. No.: 10/395,641

(22) Filed: Mar. 24, 2003

(65) Prior Publication Data

US 2003/0165777 A1 Sep. 4, 2003

Related U.S. Application Data

(63) Continuation-in-part of application No. 09/873,598, filed on Jun. 4, 2001, now Pat. No. 6,541,183.

(51) Int. Cl.[7] ............................. G03F 7/30; G03F 7/11; G03F 7/40; G03F 7/20
(52) U.S. Cl. ..................... 430/302; 430/292; 430/945; 430/271.1; 430/273.1; 430/303; 430/309
(58) Field of Search ........................................ 430/302

(56) References Cited

U.S. PATENT DOCUMENTS

| | | | |
|---|---|---|---|
| 3,905,815 A | 9/1975 | Bonham | 96/68 |
| 3,954,475 A | 5/1976 | Bonham et al. | 96/67 |
| 4,258,123 A * | 3/1981 | Nagashima et al. | 430/281.1 |
| 4,940,647 A * | 7/1990 | Frommeld et al. | 430/271.1 |
| 4,942,111 A * | 7/1990 | Wade et al. | 430/273.1 |
| 4,997,745 A | 3/1991 | Kawamura et al. | 430/281 |
| 5,085,669 A * | 2/1992 | Frommeld et al. | 8/568 |
| 5,561,029 A | 10/1996 | Fitzgerald et al. | 430/281.1 |
| 5,837,586 A | 11/1998 | Perron | 430/285 |
| 6,014,929 A | 1/2000 | Teng | 101/456 |
| 6,071,675 A * | 6/2000 | Teng | 430/302 |
| 6,153,356 A | 11/2000 | Urano et al. | 430/281.1 |
| 6,232,038 B1 | 5/2001 | Takasaki et al. | 430/281.1 |
| 6,242,156 B1 | 6/2001 | Teng | 430/271.1 |
| 6,482,571 B1 | 11/2002 | Teng | 430/302 |

OTHER PUBLICATIONS

Fact Sheet, Fountain Solution Solutions, dated Jun. 1996 and copyright by PNEAC of 2000, 6 pages from PNESC, FAct Sheets and CAse Studies at www.pneac.org/sheets/litho/fountain produced by Todd MacFadden.*

* cited by examiner

Primary Examiner—Cynthia Hamilton

(57) ABSTRACT

Lithographic printing plates having on a hydrophilic substrate an oleophilic photosensitive layer comprising an oleophilic polymer, a free radical polymerizable monomer, and 4-piperonyl-2,6-bis(trichloromethyl)-s-triazine as free radical initiator and/or leucomalachite green as exposure indicating dye; wherein the weight ratio of the monomer to the polymer is larger than 1.0. The plates can be developed with ink and/or fountain solution on a lithographic printing press or with a non-alkaline aqueous developer comprising 60–99% by weight of water and 0.5 to 40% by weight of an alcohol solvent. A photosensitive dye can be added in the photosensitive layer to provide photosensitivity to a specific wavelength between 200 and 1200 nm. Unlike commonly used s-triazine initiator or leuco dye, 4-piperonyl-2,6-bis(trichloromethyl)-s-triazine or leucomalachite green does not insolubilize from the photosensitive layer.

30 Claims, No Drawings

NEGATIVE LITHOGRAPHIC PRINTING PLATE COMPRISING A SPECIFIC COMPOUND IN THE PHOTOSENSITIVE LAYER

RELATED PATENT APPLICATIONS

This application is a continuation-in-part application of U.S. patent application Ser. No. 09/873,598 filed Jun. 4, 2001 now U.S. Pat. No. 6,541,183.

FIELD OF THE INVENTION

This invention relates to lithographic printing plates. More particularly, it relates to on-press ink and/or fountain solution developable or non-alkaline aqueous developable negative lithographic plates comprising 4-piperonyl-2,6-bis(trichloromethyl)-s-triazine as free radical initiator and/or leucomalachite green as exposure indicating dye.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask that is placed between the light source and the plate. With the advance of laser and computer technologies, laser sources have been increasingly used to directly expose a printing plate according to digital imaging information.

Currently, most commercial lithographic plates require a development process after the plates being exposed and before put on press. A liquid developer is used to dissolve and clean off the non-exposed areas (for negative plate) or the exposed areas (for positive plate). On-press developable lithographic printing plates have been disclosed in the literature. Such plates can be directly mounted on press after exposure to develop with ink and/or fountain solution during the initial printing operation and then to print out regular printed sheets. No separate development process before mounting on press is needed, allowing savings on labor, material, and developer waste disposal costs. Among the on-press developable lithographic printing plates are U.S. Pat. Nos. 5,258,263, 5,407,764, 5,516,620, 5,561,029, 5,616,449, 5,677,110, 5,811,220, and 6,014,929.

Negative lithographic printing plates having on a substrate a photopolymerizable layer comprising a polymer, an ethylenically unsaturated monomer, and an initiator have been described in the literature, such as U.S. Pat. Nos. 3,905,815, 3,954,475, 3,987,037, and 4,997,745. Various additives such as surfactant and exposure indicating dye can be added. Among the initiator, trichloromethyl substituted triazine compounds are preferred because of their high efficiency. The inventor found that in order to be able to develop on press with ink and/or fountain solution or develop with a non-alkaline aqueous developer, the monomer to polymer weight ratio should be preferably larger than 1.0, more preferably larger than 1.5, and most preferably larger than 2.0. However, the inventor further found that, at such higher monomer to polymer ratios, the plate tends to show fingerprints of non-hardening in the finger pressed areas with a typical trichloromethyl substituted triazine initiator such as 4-(4-methoxynaphthyl)-2,6-bis(trichloromethyl)-s-triazine, and tends to show non-printout in the finger pressed areas with a typical exposure indicating dye such as leuco crystal violet, apparently due to insolubilization or crystalization of the initiator or the exposure indicating dye in the finger pressed areas.

However, applicant found, surprisingly, that 4-piperonyl-2,6-bis(trichloromethyl)-s-triazine when formulated into the above plate with a monomer to polymer ratio of larger than 1.0 does not cause fingerprints of non-hardening in the finger pressed areas. Applicant also found that leucomalachite green when formulated into the above plate with a monomer to polymer ratio of lager than 1.0 does not cause fingerprints of non-printout in the finger pressed areas.

Also, 4-piperonyl-2,6-bis(trichloromethyl)-s-triazine has an absorbency maximum of 356 nm that is below the absorbency maximum range of 360–400 nm for typical ultraviolet sensitive plates, and is an unlikely candidate for ultraviolet sensitive plates. However, applicant found, surprisingly, photopolymer plate comprising 4-piperonyl-2,6-bis(trichloromethyl)-s-triazine has excellent photosensitivity when exposed to a typical ultraviolet radiation.

SUMMARY OF THE INVENTION

This invention provides a negative lithographic printing plate comprising (i) a hydrophilic substrate and (ii) an oleophilic photosensitive layer comprising a polymer, a free radical polymerizable ethylenically unsaturated monomer, and 4-piperonyl-2,6-bis(trichloromethyl)-s-triazine; wherein the weight ratio of the monomer to the polymer is larger than 1.0. Here, 4-piperonyl-2,6-bis(trichloromethyl)-s-triazine can be the primary radiation absorber, or a photosensitizer can be added as the main radiation absorber. The chemical structure of 4-piperonyl-2,6-bis(trichloromethyl)-s-triazine is shown below.

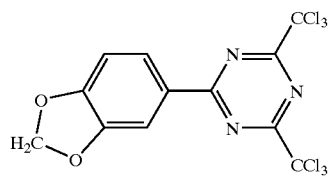

This invention further provides a negative lithographic printing plate comprising (i) a hydrophilic substrate and (ii) an oleophilic photosensitive layer comprising a polymer, a free radical polymerizable ethylenically unsaturated monomer, an initiator, and leucomalachite green; wherein the weight ratio of the monomer to the polymer is larger than 1.0. Here, the initiator can be the primary radiation absorber, or a photosensitizer can be added as the main radiation absorber. The chemical structure of leucomalachite green is shown below.

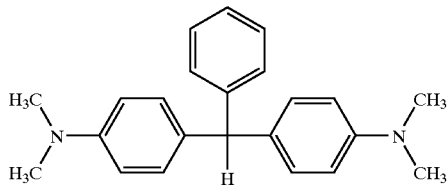

This invention further provides a method of imagewise exposing the above lithographic printing plate (any of the above plates) with a radiation to cause hardening of the photosensitive layer in the exposed areas and then developing the plate with ink and/or fountain solution on a lithographic printing press during the initial printing operation, wherein the photosensitive layer is soluble or dispersible in ink and/or fountain solution.

This invention further provides a method of imagewise exposing the above lithographic printing plate (any of the above plates) with a radiation to cause hardening of the photosensitive layer in the exposed areas and then developing the plate with a non-alkaline aqueous developer comprising 60–99% by weight of water and 0.5 to 40% by weight of an alcohol solvent and having a pH of 3.0 to 10.0.

The plate can be exposed with an actinic radiation through a photomask or by direct exposure according to digital imaging information. For direct exposure, a laser is a preferred radiation source.

For on-press developable plate, the plate can be imaged off press and then mounted on a lithographic printing press for on-press development with ink and/or fountain solution and lithographic printing. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

The support employed in the lithographic plates of this invention can be any support that provides a hydrophilic surface. Such a support may be a metal sheet, a polymer film, or a coated paper. Aluminum (including aluminum alloys) sheet is a preferred support. Particularly preferred is an aluminum support that has been grained and anodized, with or without further deposition of a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic printing plate application are well known in the art, and examples can be found in U.S. Pat. Nos. 2,714,066, 4,153,461, 4,399,021, and 5,368,974.

In one embodiment of this invention, the photosensitive layer comprises an oleophilic polymer, a free radical polymerizable ethylenically unsaturated monomer, and 4-piperonyl-2,6-bis(trichloromethyl)-s-triazine as free radical initiator; wherein the weight ratio of the monomer to the polymer is larger than 1.0. The photosensitive layer is capable of hardening upon exposure to an actinic radiation in ultraviolet, visible or infrared region. 4-piperonyl-2,6-bis(trichloromethyl)-s-triazine is added in the photosensitive layer preferably at 0.1 to 30% by weight of the photosensitive layer, more preferably at 0.4 to 20%, and most preferably at 1 to 10%. The monomer to polymer weight ratio is preferably larger than 1.5, and more preferably larger than 2.0. Various additives such as surfactant, dye, pigment, exposure indicating dye, and free-radical stabilizer (such as methoxyhydroquinone) may be added. A photosensitizer can be added to achieve spectral sensitivity, especially in the wavelength at which 4-piperonyl-2,6-bis(trichloromethyl)-s-triazine has low or no absorbency.

In another embodiment of this invention, the photosensitive layer comprises an oleophilic polymer, a free radical polymerizable ethylenically unsaturated monomer, a free radical initiator, and leucomalachite green as exposure indicating dye; wherein the weight ratio of the monomer to the polymer is larger than 1.0. The photosensitive layer is capable of hardening upon exposure to an actinic radiation in ultraviolet, visible or infrared region. Leucomalachite green is added in the photosensitive layer preferably at 0.1 to 20% by weight of the photosensitive layer, more preferably at 0.5 to 10%, and most preferably at 1 to 5%. The monomer to polymer weight ratio is preferably larger than 1.5, and more preferably larger than 2.0. Various additives such as surfactant, dye, pigment, and free-radical stabilizer (such as methoxyhydroquinone) may be added. A photosensitizer can be added to achieve spectral sensitivity, especially in the wavelength at which the free radical initiator has low or no absorbency. The free radical initiator can be any photoinitiator, including any trichloromethyl substituted triazine or photoinitiating system that does not become insoluble from the photosensitive layer when pressed with fingers. Suitable free-radical initiators include, for example, 4-piperonyl-2,6-bis(trichloromethyl)-s-triazine, the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, diaryliodonium salts, triarylsulfonium salts, alkyltriarylborate salts, and titanocene (such as bis($\eta^9$-2,4-cyclopentadien-1-yl)bis[2,6-difluoro-3-(1H-pyrrol-1-yl)phenyl) titanium). 4-piperonyl-2,6-bis(trichloromethyl)-s-triazine is a preferred initiator.

In this patent, the term monomer includes both monomer and oligomer, and the term (meth)acrylate includes both acrylate and methacrylate. The photosensitive layer can comprise one or more monomers and one or more polymers. In calculating the weight ratio of the monomer to the polymer, the weight of the monomer includes the total weight of all monomers and the weight of the polymer includes the total weight of all polymers.

The photosensitive layer preferably has a coverage of 0.1 to 3.0 g/m², more preferably 0.3 to 2.0 g/m², and most preferably 0.5 to 1.5 g/m². The term hardening means becoming insoluble in a developer (negative-working). For non-alkaline aqueous developable plate, the developer is a non-alkaline aqueous developer comprising 60–99% by weight of water and 0.5 to 40% by weight of an alcohol solvent and having a pH of 3.0 to 10.0. For on-press developable plates, the developer can be ink and/or fountain solution. In order to be useful for the on-press developable plate of this invention, the photosensitive layer (in the non-hardened areas) must be soluble or dispersible in ink and/or fountain solution and can be developed off on a lithographic press with ink and/or fountain solution.

The photosensitive layer can be sensitized to any radiation having a wavelength between 200 and 1200 nm. The radiation can be a conventional light, such as from a high-pressure mercury lamp, a xenon lamp, or a fluorescence lamp (usually requiring a mask), or can be a laser that directly images according to digital imaging information. For exposure with a conventional light through a photomask, ultraviolet light is a preferred light source. For exposure with a radiation according to digital imaging information, laser is a preferred radiation source and diode laser is more preferred. Laser diodes are especially useful because of their small sizes and relatively low costs. Preferred visible or ultraviolet light lasers include, for example, frequency-doubled Nd/YAG laser (about 532 nm), argon ion laser (about 480 nm), violet diode laser (about 410 nm), and ultraviolet laser (below 400 nm). Among the visible and ultraviolet lasers, violet laser is more preferred because of its low cost. Preferred infrared lasers are laser diodes emitting around 830 nm or Nd/YAG laser emitting around 1060 nm. The exposure dosage is preferably about 0.001 to about 1000 $mJ/cm^2$, and more preferably about 0.1 to about 500 $mJ/cm^2$, depending on the sensitivity of the photosensitive layer.

Semisolid photosensitive layer comprising an oleophilic polymer, a free radical polymerizable ethylenically unsaturated monomer, and 4-piperonyl-2,6-bis(trichloromethyl)-s-triazine or semisolid photosensitive layer comprising an oleophilic polymer, a free radical polymericable ethylenically unsaturated monomer, a free radical initiator, and leucomalachite green as described in U.S. patent application Ser. Nos. 09/873,598 and U.S. Pat. No. 6,495,310 can be used for the photosensitive layer of this invention, the entire disclosures of which is hereby incorporated by reference.

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

The oleophilic polymer for the photosensitive layer of this invention can be any oleophilic film-forming polymer. Examples of suitable oleophilic polymers include (meth) acrylic polymers and copolymers (such as polybutylmethacrylate, polyethylmethacrylate, polymethylmethacrylate, polymethylacrylate, and butylmethacrylate/methylmethacrylate copolymer), polyvinyl acetate, polyvinyl butyrate, polyvinyl chloride, styrene/acrylonitrile copolymer, nitrocellulose, cellulose acetate butyrate, cellulose acetate propionate, vinyl chloride/vinyl acetate copolymer, butadiene/acrylonitrile copolymer, and polyurethane binder. Polymers with acidic (such as carboxylic acid) or basic (such as amine) groups may also be used. The polymers may or may not have polymerizable ethylenically unsaturated functional groups.

Various surfactants may be added into the photosensitive layer to allow or enhance the on-press developability with ink and/or fountain solution or developability with non-alkaline aqueous solution. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

For plates with rough and/or porous surface capable of mechanical interlocking with a coating deposited thereon, a thin water soluble interlayer may be deposited between the substrate and the photosensitive layer. Here the substrate surface is rough and/or porous enough and the interlayer is thin enough to allow bonding between the thermosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The releasable interlayer preferably has an average coverage of 1 to 200 $mg/m^2$, more preferably 2 to 100 $mg/m^2$, and most preferably 4 to 40 $mg/m^2$. The substrate preferably has an average surface roughness Ra of 0.2 to about 2.0 microns, and more preferably 0.4 to 1.0 microns.

A water soluble or dispersible overcoat can be coated on the photosensitive layer to, for example, improve the photospeed, surface durability, and/or (for on-press developable plate) on-press developability of the plate. The overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 4.0 $g/m^2$, more preferably from 0.01 to 2.0 $g/m^2$, and most preferably from 0.1 to 1.0 $g/m^2$.

The on-press developable plate is usually exposed on an exposure device, and then mounted on press to develop with ink and/or fountain solution and then print out regular printed sheets. However, the plate can also be exposed on a printing press cylinder, and the exposed plate can be directly developed on press with ink and/or fountain solution and then print out regular printed sheets. For on-press development, good quality prints should be obtained preferably under 20 initial impressions, and more preferably under 5 impressions. The plate may be rinsed or applied with an aqueous solution, including water and fountain solution, to remove the water soluble or dispersible overcoat (for plate with an overcoat) and/or to dampen without developing the plate, after imagewise exposure and before on-press development with ink and/or fountain solution.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the on-press developable plate as well as the non-alkaline aqueous developable plate of this invention.

The non-alkaline aqueous developer is an aqueous solution comprising 60–99% by weight of water and 0.5 to 40% by weight of an alcohol solvent and having a pH of 3.0 to 10.0. The alcohol solvent is defined as a water-soluble liquid organic compound having at least one hydroxyl group. The alcohol solvent must be soluble in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 1 to 30% by weight of the developer and more preferably at 2 to 20%.

Various surfactants can be added into the developer to, for example, help the wetting of the developer on the plate, improve the developability, reduce solid residue in the developer, and condition the bared substrate. Either ionic or nonionic water-soluble surfactant or both can be used. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, and ammonium laurylsulfate. The surfactant is preferably added at from 0.01 to 20% by weight of the developer, more preferably from 0.1 to 10%, and most preferably 0.5 to 5%. Various other additives, such as defoamer, bactericide, dye, and substrate conditioner (such as gum arabic, and maltodextrin), can be added. Certain salts, such as sodium butylnaphthalenesulfate, sodium chloride, and ammonium sulfite, potassium phosphate, sodium cumenesulfonate, may be added to, for example, improve the hydrophilicity of the bared substrate.

The non-alkaline aqueous developer should have a pH of 3.0 to 10.0, preferably 5.0 to 9.0, more preferably 6.0 to 8.0. Unlike conventional alkaline developer which has higher concentration of strong base (such as 5–10% sodium silicate or potassium silicate) and a pH of above 12.0, the instant developer is neutral or slightly to moderately basic or acidic. While a pH of close to neutral (pH of about 7.0) is preferred, the pH may be slightly to moderately basic or acidic due to addition of certain additives for improving, for example, the hydrophilicity of the substrate. For example, phosphoric acid or citric acid may be added to improve the hydrophilicity of certain substrate; and small amount of diethanolamine may be added to adjust the pH to slightly basic to improve the hydrophilicity of certain substrate.

The invention is further illustrated by the following non-limiting examples of its practice.

EXAMPLE 1

An electrochemically roughened, anodized, and silicated aluminum substrate with an Ra of about 0.5 microns was coated with a photosensitive layer PS-1 using a #6 Meyer rod, followed by drying in an oven at 90° C. for 2 min. PS-1

| Component | Weight (g) |
| --- | --- |
| Neocryl B-728 (Polymer from Zeneca) | 2.483 |
| Ebecryl RX-8301 (Oligomer from UCB Chemicals) | 1.641 |
| Sartomer SR-399 (Monomer from Sartomer Company) | 4.293 |
| Pluronic L43 (Surfactant from BASF) | 0.513 |
| Leucomalachite green (Exposure indicator) | 0.526 |
| 2,6-Di-tert-butyl-4-methylphenol (Antioxidant) | 0.011 |
| Irganox 1035 (Antioxidant from Ciba-Geigy) | 0.011 |
| 4-piperonyl-2,6-bis(trichloromethyl)-s-triazine (Initiator) | 0.522 |
| 2-Butanone | 90.000 |

The above coated plate was first pressed firmly with fingers on the photosensitive layer surface in various areas (including areas which will receive full exposure), and then exposed through a negative mask to an ultraviolet light with an emission maximum of about 365 nm under vacuum for 2 minutes, using an ultraviolet light exposure device with a 1000 watts light bulb. The exposed plate was cut into two sheets for further evaluation.

The first sheet of the exposed plate was visually examined for any fingerprints. The exposed plate showed uniform green printout in the exposed areas. No fingerprints were observed in any area of the plate, including the areas pressed with fingers and received full exposure. The plate was then developed with a non-alkaline aqueous developer containing 5% by weight of benzyl alcohol. The developed plate showed well-defined imaging without any fingerprints.

The second sheet of the exposed plate was hand tested for on-press development and inking by rubbing with a cloth soaked with ink and fountain solution. After rubbing with the cloth for 20 times, the non-exposed areas showed clean background and the exposed areas were well inked. No fingerprints were observed.

EXAMPLE 2 (COMPARATIVE EXAMPLE FOR EXAMPLE 1)

The plate was prepared the same as in EXAMPLE 1 except that the photoinitiator 4-piperonyl-2,6-bis(trichloromethyl)-s-triazine in PS-1 was replaced with a commonly used s-triazine photoinitiator 4-(4-methoxynaphthyl)-2,6-bis(trichloromethyl)-s-triazine.

The plate was evaluated the same as in EXAMPLE 1. The exposed plate showed fingerprints of weak printout in the exposed areas that were pressed with fingers. The exposed areas that were pressed with fingers were partially or completely removed by the developer. After rubbing with a cloth soaked with both fountain solution and ink, the exposed areas that were pressed with fingers showed poor or no ink receptivity.

EXAMPLE 3 (COMPARATIVE EXAMPLE FOR EXAMPLE 1)

The plate was prepared the same as in EXAMPLE 1 except that the exposure indicating dye leucomalachite green was replaced with a commonly used exposure indicating dye leuco crystal violet. The plate was evaluated the same as in EXAMPLE 1. The exposed plate showed fingerprints of weak printout in the exposed areas that were pressed with fingers.

EXAMPLE 4

The plate was the same as in EXAMPLE 1 except that a releasable interlayer was inserted between the photosensitive layer and the substrate. An electrochemically roughened, anodized, and silicated aluminum substrate was first coated with a 0.1% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with a photosensitive layer PS-1 using a #6 Meyer rod, followed by drying in an oven at 90° C. for 2 min.

The coated plate was first pressed firmly with fingers on the photosensitive layer surface in various areas (including areas which will receive full exposure), and then exposed through a negative mask to an ultraviolet light with an emission maximum of about 365 nm under vacuum for 2 minutes, using an ultraviolet light exposure device with a 1000 watts light bulb.

The exposed plate was directly mounted on the plate cylinder of a lithographic press (AB Dick 360) for on-press development. The press was started for 10 rotations (with the fountain roller on), and the ink roller (carrying emulsion of ink and fountain solution) was then applied to the plate cylinder to rotate for 10 rotations. The plate cylinder was then engaged with the blanket cylinder and printed with papers. The printed sheets showed good inking in exposed areas and clean background in non-exposed areas under 2 impressions. The plate continued to run for a total of 10,000 impressions without showing any wearing. No fingerprints were observed in any areas of the printed sheets.

EXAMPLE 5

An electrochemically grained and anodized aluminum substrate with an Ra of about 0.5 microns was coated with a photosensitive layer formulation PS-2 using a #6 Meyer rod, followed by drying in an oven at 90° C. for 2 min.

PS-2

| Component | Weight (g) |
| --- | --- |
| Neocryl B-728 (Polymer from Zeneca) | 2.389 |
| Ebecryl RX8301 (Oligomer from UCB Chemicals) | 0.767 |
| Sartomer SR-399 (Monomer from Sartomer) | 5.257 |
| Irgacure 907 (Initiator from Ciba-Geigy) | 0.382 |
| Isopropyl thioxanthone (Sensitizer) | 0.191 |
| Methoxyether hydroquinone (Antioxidant) | 0.010 |
| Irganox 1035 (Antioxidant from Ciba Geigy) | 0.010 |
| Microlitho Blue 4G-K (Blue pigment from Ciba Geigy) | 0.229 |
| Leucomalachite green (Exposure indicator) | 0.382 |
| Pluronic L43 (Surfactant from BASF) | 0.382 |
| Methylethylketone | 90.000 |

The above coated plate was first pressed firmly with fingers on the photosensitive layer surface in various areas (including areas which will receive full exposure), and then exposed through a negative mask to an ultraviolet light with an emission maximum of about 365 nm under vacuum for 2 minutes, using an ultraviolet light exposure device with a 1000 watts light bulb. The exposed plate showed greenish blue color in the exposed areas compared to the light blue color in the non-exposed areas, without any fingerprints of weak printout in the exposed areas. The plate was further developed with a non-alkaline aqueous developer containing 5% by weight of benzyl alcohol. The developed plate showed well-defined imaging with uniform greenish blue color.

EXAMPLE 6 (COMPARATIVE EXAMPLE FOR EXAMPLE 5)

The plate was prepared the same as in EXAMPLE 5 except that the exposure indicating dye leucomalachite green in PS-2 was replaced with a commonly used exposure indicating dye leuco crystal violet. The plate was evaluated the same as in EXAMPLE 5. The exposed areas except for the areas also pressed with fingers became purplish blue, compared to the light blue in the non-exposed areas. The exposed plate showed fingerprints of weak printout in the exposed areas that were pressed with fingers.

EXAMPLE 7

An electrochemically roughened and anodized aluminum sheet was first coated with a 0.1% (by weight) aqueous solution of polyvinyl alcohol (Airvol 540, from Air Products) with a #6 Meyer rod, followed by drying in an oven at 90° C. for 2 min. The polyvinyl alcohol coated substrate was further coated with the photosensitive layer formulation PS-2 with a #6 Meyer rod, followed by drying in an oven at 90° C. for 2 min.

PS-3

| Component | Weight ratios |
| --- | --- |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 4-piperonyl-2,6-bis(trichloromethyl)-s-triazine | 1.00 |
| ADS-830AT (Infrared absorbing cyanine dye from American Dye Source) | 0.10 |
| Acetone | 90.0 |

The photosensitive layer coated plate was further coated with a water-soluble overcoat OC-1 using a #6 Meyer rod, followed by hot air blow drying and baking in an oven at 90° C. for 2 min.

OC-1

| Component | Weight ratios |
| --- | --- |
| Airvol 203 (Polyvinyl alcohol from Air Products) | 5.0 |
| Triton X-100 (Surfactant from Union Carbide) | 0.20 |
| Water | 95.0 |

The above coated plate was first pressed firmly with fingers on the photosensitive layer surface in various areas, and then exposed with an infrared laser imager equipped with laser diodes emitting at about 830 nm (Pearlsetter from Presstek) at a laser dosage of about 350 mJ/cm$^2$. The plate was cut into two sheets for further evaluation.

The first sheet of the exposed plate was developed with a non-alkaline aqueous developer containing 5% by weight of benzyl alcohol, and then rubbed with a cloth soaked with fountain solution and ink. The plate showed well-defined inked imaging in the exposed areas and clean background areas. No fingerprints were observed.

The second sheet of the exposed plate was directly mounted on the plate cylinder of a lithographic press (AB Dick 360) for on-press development. The press was started for 10 rotations (with the fountain roller on), and the ink roller (carrying emulsion of ink and fountain solution) was then applied to the plate cylinder to rotate for 10 rotations. The plate cylinder was then engaged with the blanket cylinder and printed with papers. The printed sheets showed good inking in exposed areas and clean background in non-exposed areas under 2 impressions. The plate continued to run for a total of 500 impressions without showing any wearing (The press stopped at 500 impressions.). No fingerprints were observed in any areas of the printed sheets.

I claim:

1. A method of processing a lithographic printing plate comprising in order:
   (a) providing a lithographic printing plate comprising (i) a hydrophilic substrate and (ii) an oleophilic photosensitive layer comprising an oleophilic polymer, a free radical polymerizable ethylenically unsaturated monomer, and 4-piperonyl-2,6-bis(trichloromethyl)-s-triazine; wherein said photosensitive layer is soluble or dispersible in ink and/or fountain solution and capable of hardening upon exposure to a radiation, and the weight ratio of the monomer to the polymer is larger than 2.0;
   (b) imagewise exposing the plate with said radiation to cause hardening of the photosensitive layer in the exposed areas; end
   (c) contacting said exposed plate with ink and/or fountain solution on a lithographic printing press to remove the non-hardened areas of the photosensitive layer, and to lithographically print images from said plate to the receiving medium.

2. The method of claim 1 wherein said radiation is a conventional ultraviolet light and said plate is exposed with said radiation through a photomask.

3. The method of claim 2 wherein said plate further includes leucomalachite green as exposure indicating dye in the photosensitive layer.

4. The method of claim 1 wherein said radiation is a laser having a wavelength between 300 and 420 nm and said plate is exposed with said laser according to digital imaging information.

5. The method of claim 1 wherein said photosensitive layer further includes a photosensitive dye having an absorption maximum between 200 and 1200 nm, and said radiation is a laser having a wavelength around the absorption maximum of the photosensitive dye.

6. The method of claim 1 wherein said photosensitive layer further includes a photosensitive dye having an absorption maximum between 380 and 420 nm, and said radiation is a violet laser.

7. The method of claim 3 wherein said plate further includes a water soluble interlayer interposed between the substrate and the photosensitive layer; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the photosensitive layer and the substrate through mechanical interlocking.

8. The method of claim 1 wherein said plate further includes a water soluble or dispersible overcoat on the photosensitive layer.

9. The method of claim 1 wherein said radiation is a laser and said plate is imagewise exposed with the laser while mounted on the plate cylinder of a lithographic press.

10. A method of processing a lithographic printing plate comprising in order:
    (a) providing a lithographic printing plate comprising (i) a hydrophilic substrate and (ii) an oleophilic photosensitive layer comprising an oleophilic polymer, a free radical polymerizable ethylenically unsaturated monomer, and 4-piperonyl-2,6-bis(trichloromethyl)-s-triazine; wherein said photosensitive layer is capable of hardening upon exposure to a radiation and the weight ratio of the monomer to the polymer is larger than 1.0;
    (b) imagewise exposing the plate with said radiation to cause hardening of the photosensitive layer in the exposed areas; and
    (c) developing said exposed plate with an aqueous developer comprising 60–99% by weight of water and 0.5 to 40% by weight of an alcohol solvent and having a pH of 3.0 to 10.0.

11. The method of claim 10 wherein said radiation is a conventional ultraviolet light and said plate is exposed with said radiation through a photomask.

12. The meted of claim 11 wherein said plate further includes leucomalachite green as exposure indicating dye in the photosensitive layer.

13. The method of claim 10 wherein said radiation is a laser having a wavelength between 300 and 420 nm and said plate is exposed with said laser according to digital imaging information.

14. The method of claim 10 wherein said photosensitive layer further includes a photosensitive dye having an absorption maximum between 200 and 1200 nm, and said radiation is a laser having a wavelength around the absorption maximum of the photosensitive dye.

15. The method of claim 10 wherein said photosensitive layer further includes a photosensitive dye having an absorption maximum between 380 and 420 nm, and said radiation is a violet laser.

16. The method of claim 10 wherein the weight ratio of the monomer to the polymer is larger than 1.5.

17. The method of claim 10 wherein the weight ratio of the monomer to the polymer is larger than 2.0.

18. The method of claim 10 wherein said alcohol solvent is selected from the group consisting of liquid water-soluble alkyl alcohol, arylalkyl alcohol, alkoxyalkyl alcohol, arylalkoxyalkyl alcohol, aroxyalkyl alcohol, oxydialkanol, and alkyl lactate.

19. The method of claim 10 wherein said alcohol solvent is selected from the group consisting of beozyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol, phenoxyethanol, and phenoxypropanol.

20. The method of claim 10 wherein said aqueous developer comprises 2 to 20% by weight of an alcohol solvent.

21. The method of claim 10 wherein said aqueous developer has a pH of 5.0 to 9.0.

22. The method of claim 10 wherein said aqueous developer has a pH of 6.0 to 8.0.

23. A method of processing a lithographic printing plate comprising in order:

(a) providing a lithographic printing plate comprising (i) a hydrophilic substrate and (ii) an oleophilic photosensitive layer comprising an oleophilic polymer, a free radical polymerizable ethylenically unsaturated monomer, a free radical initiator, and leucomalachite green; wherein said photosensitive layer is soluble or dispersible in ink and/or fountain solution and capable of hardening upon exposure to a radiation, and the weight ratio of the monomer to the polymer is larger than 2.0;

(b) imagewise exposing the plate with said radiation to cause hardening of the photosensitive layer in the exposed areas; and (c) contacting said exposed plate with ink and fountain solution on a lithographic printing press to remove the non-hardened areas of the photosensitive layer, and to lithographically print images from said plate to the receiving medium.

24. A method of processing a lithographic printing plate comprising in order:

(a) providing a lithographic printing plate comprising (i) a hydrophilic substrate and (ii) an oleophilic photosensitive layer comprising an oleophilic polymer, a free radical polymerizable ethylenically unsaturated monomer, a free radical initiator, and leucomalachite green; wherein said photosensitive layer is capable of hardening upon exposure to a radiation and the weight ratio of the monomer to the polymer is larger than 1.0:

(b) imagewise exposing the plate with said radiation to cause hardening of the photosensitive layer in the exposed areas; and (c) developing said exposed plate with an aqueous developer comprising 60–99% by weight of water and 0.5 to 40% by weight of an alcohol solvent and having a pH of 3.0 to 10.0.

25. The method of claim 24 wherein the weight ratio of the monomer to the polymer is larger than 1.5.

26. The method of claim 24 wherein the weight ratio of the monomer to the polymer is larger than 2.0.

27. The method of claim 10 wherein said alcohol solvent is benzyl alcohol.

28. The method of claim 24 wherein said alcohol solvent is selected from the group consisting of liquid water-soluble alkyl alcohol, arylalkyl alcohol, alkoxyalkyl alcohol, arylalkoxyalkyl alcohol, aroxyalkyl alcohol, oxydialkanol, and alkyl lactate.

29. The method of claim 24 wherein said alcohol solvent is benzyl alcohol.

30. The method of claim 24 wherein said aqueous developer has a pH of 6.0 to 8.0.

* * * * *